United States Patent
Avouris et al.

(10) Patent No.: US 7,115,916 B2
(45) Date of Patent: Oct. 3, 2006

(54) SYSTEM AND METHOD FOR MOLECULAR OPTICAL EMISSION

(75) Inventors: Phaedon Avouris, Yorktown Heights, NY (US); Guy Moshe Cohen, Mohegan Lake, NY (US); Richard Martel, Montreal (CA); James A. Misewich, Peekskill, NY (US); James Chen-Hsiang Tsang, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 10/255,351

(22) Filed: Sep. 26, 2002

(65) Prior Publication Data

US 2004/0061422 A1 Apr. 1, 2004

(51) Int. Cl.
*H01L 33/00* (2006.01)
*H01L 29/24* (2006.01)

(52) U.S. Cl. ............... 257/103; 257/E51.04; 977/938; 977/949; 977/742

(58) Field of Classification Search ............ 257/13, 257/79, 103, 85, 86, 107, E51.04, 40; 438/962; 977/1, 742, 938, 949
See application file for complete search history.

(56) References Cited

U.S. PATENT DOCUMENTS

| | | | |
|---|---|---|---|
| 6,515,339 B1 * | 2/2003 | Shin et al. | 257/368 |
| 2002/0014622 A1 * | 2/2002 | Shimoyama et al. | 257/14 |
| 2002/0064894 A1 * | 5/2002 | Lee | 438/30 |

OTHER PUBLICATIONS

Gudiksen, Mark S., et al., *Growth of nanowire superlattice structures for nanoscale photonics and electronics*, Nature, vol. 415, Feb. 7, 2002, pp. 617-620.
Zhou, Chongwu et al., *Modulated chemical doping of individual carbon nanotubes*, Science, vol. 290, Nov. 24, 2000, pp. 1552-1555.
Schon, J.H., et al., *A light-emitting field-effect transistor*, Science, vol. 290, Nov. 3, 2000, pp. 963-965.
Schon, J.H., et al., *An organic solid state injection laser*, Science, vol. 289, Jul. 28, 2000, pp. 599-601.

\* cited by examiner

*Primary Examiner*—Kenneth Parker
*Assistant Examiner*—Matthew C. Landau
(74) *Attorney, Agent, or Firm*—F. Chau & Associates LLC

(57) ABSTRACT

A light emitting device comprises a gate electrode, a channel comprising a molecule for electrically stimulated optical emission, wherein the molecule is disposed within an effective range of the gate electrode, a source coupled to a first end of the channel injecting electrons into the channel, and a drain coupled to a second end of the channel injecting holes into the channel.

6 Claims, 6 Drawing Sheets

SYSTEM AND METHOD FOR MOLECULAR OPTICAL EMISSION

BACKGROUND OF THE INVENTION

1. Field of the Invention

The present invention relates to light emitting devices (LEDs), and more particularly towards a carbon nanotube LED.

2. Description of Prior Art

Economics has driven the integration of photonic structures on wafers for some time. However, to take full advantage of the unique opportunities presented by recent advances in the construction of photonic bandgap structures, nanoscale devices are needed capable of optical emission when driven by electrical currents as well as photo-excitation. Conventional semiconductor photonic structures based on Silicon need either integration of direct bandgap materials or micro-porous Silicon to provide a photon source, both of which are associated with strong technical challenges and have yet to be realized as practical.

Therefore, a need exists for a molecular scale device capable of electrically induced optical emission, wherein the device can be compatible with Silicon technology.

SUMMARY OF THE INVENTION

According to an embodiment of the present invention, a light emitting device comprises a gate electrode, a channel comprising a molecule for electrically stimulated optical emission, wherein the molecule is disposed within an effective range of the gate electrode, a source coupled to a first end of the channel injecting electrons into the channel, and a drain coupled to a second end of the channel injecting holes into the channel.

The molecule is one of a carbon nanotube and a boron-nitride nanotube.

The gate electrode is formed within a substrate. The gate electrode is a substrate.

The molecule is substantially ambipolar. The molecule is a rectifying carbon nanotube. The molecule is one of a single-wall nanotube and a multi-wall nanotube.

A charge density is about between $10^8$ Amps/cm$^2$ and $10^9$ Amps/cm$^2$. A drain voltage is about twice a gate voltage, and the source near ground potential.

The molecule is substantially undoped. The first end of the molecule is n-doped.

The channel comprises one molecule disposed on the substrate for electrically stimulated optical emission. The channel comprises at least two molecules disposed on the substrate for electrically stimulated optical emission.

According to an embodiment of the present invention, a method for generating light comprises providing a field effect transistor comprising a source, a drain, a gate electrode and a channel comprising a molecule for electrically stimulated optical emission, the molecule having a diameter adapted to generate light of a desired wavelength. The method further comprises biasing the gate electrode with a gate voltage, forward-biasing the channel by applying a voltage between the source and the drain, and recombining an electron and a hole, wherein the recombination generates light of the desired wavelength.

The channel is one of a carbon nanotube and a boron-nitride nanotube.

The gate voltage and the voltage applied to the drain produce a charge density across the channel adapted to cause optical emission from the channel.

The light of the desired wavelength is in a portion of a spectrum including infrared and visible light.

The method comprises doping a first portion of the channel with n-dopants, wherein the first portion of the channel is proximate to the source.

The channel comprises one molecule disposed on the substrate for electrically stimulated optical emission. The channel comprises at least two molecules disposed on the substrate for electrically stimulated optical emission.

A light emitting device comprises a channel comprising a molecule for electrically stimulated optical emission, wherein the molecule comprises an n-type portion and a p-type portion forming a p-n junction within the molecule; a source coupled to the p-type portion of the molecule injecting electrons into the molecule, and a drain coupled to the n-type portion of the molecule injecting holes into the molecule.

The molecule is one of a carbon nanotube and a boron-nitride nanotube.

The molecule is forward biased. The molecule is intrinsically p-type and an end of the molecule is chemically n-doped to form the n-type portion.

According to an embodiment of the present invention, a method for generating light comprises providing a two-terminal device comprising a source, a drain and a channel comprising a molecule for electrically stimulated optical emission, wherein the molecule includes an n-type portion and a p-type portion forming a p-n junction within the molecule, wherein the molecule has a diameter adapted to generate light of a desired wavelength. The method further comprises forward-biasing the molecule by applying a voltage between the source and the drain, wherein the source is coupled to the p-type portion and the drain is coupled to the n-type portion, and recombining an electron and a hole, wherein the recombination generates light of the desired wavelength.

The molecule is one of a carbon nanotube and a boron-nitride nanotube.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

According to an embodiment of the present invention, a field-effect, single molecule device having an induced forward biased p-n junction is capable of electrically induced optical emission. The emission can be from a single 1-d molecule, for example, a carbon nanotube or a boron-nitride nanotube, offering high scaling for electrically pumped optical emission devices.

Figure 1A:
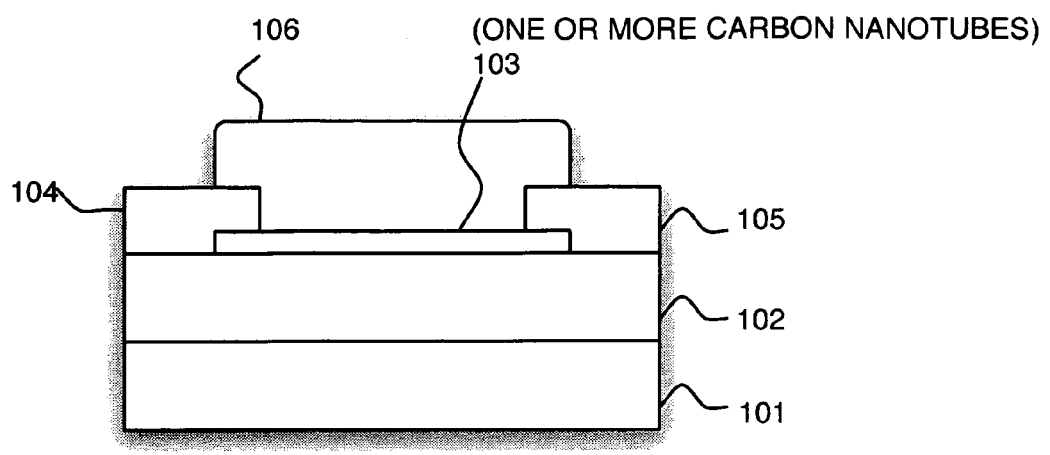
FIGS. 1A–1C are diagrams of a molecular optical emission device according to an embodiment of the present invention.
Figure 1B:
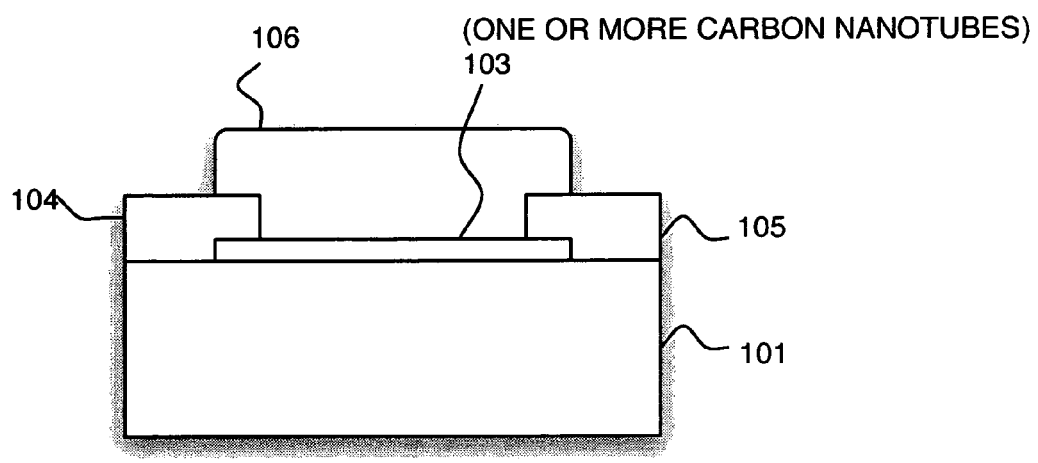
Figure 1C:
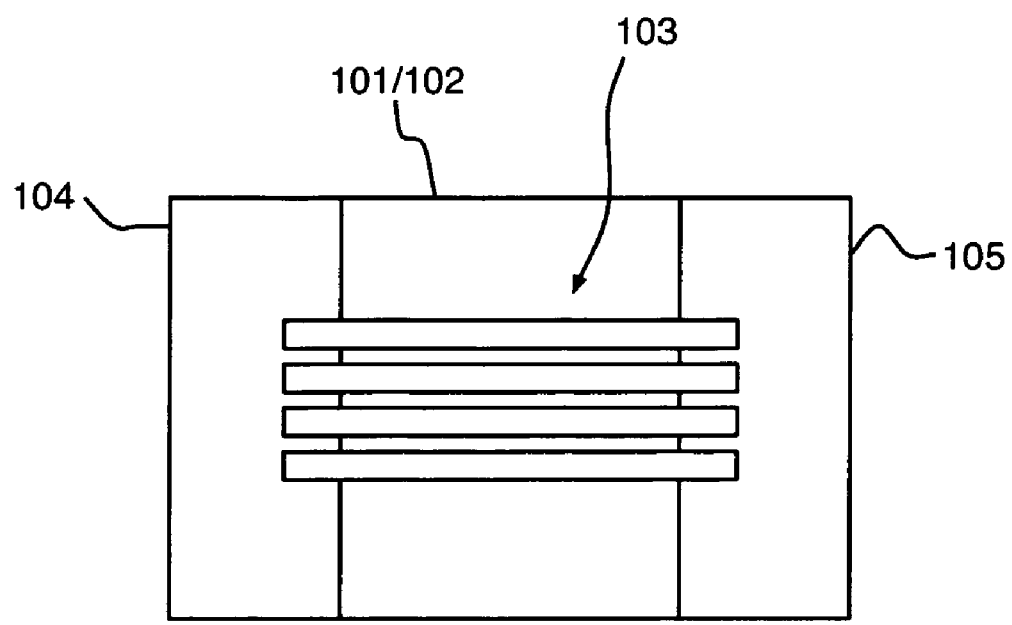

Referring to FIGS. 1A–1C, a device comprises a gate electrode 101, for example, a Silicon substrate. The gate electrode can be formed within the substrate or the gate electrode can be the substrate as shown in FIG. 1B. The device further comprises a gate oxide 102, such as a Silicon oxide layer or an Aluminum oxide layer, upon which a carbon nanotube 103 can be deposited. The carbon nanotube 103 is within an effective range of the gate electrode 101, such that the gate electrode can electrically stimulate the carbon nanotube 103 to produce an optical emission, for example, 100 nm. The carbon nanotube 103 can be, for example, a single-wall carbon nanotube having a chirality imparting a semiconducting characteristic. More than one carbon nanotube 103 can also be implemented. A source 104 and a drain 105 are formed at opposite ends of the carbon nanotube 103. A cap 106 such as a Silicon oxide can be deposited over the device.

A carbon nanotube molecule can be single-walled or multi-walled. A multi-wall nanotube has a series of concentric nanotube cylinders. Both single-wall and multi-wall nanotubes can be either metallic or semiconductor depending on chirality (i.e., conformational geometry). Metallic nanotubes can carry large current densities with constant resistivity. Semiconducting nanotubes can be electrically switched on and off as field-effect transistors (FETs). The two types may be covalently joined (sharing electrons).

Optical emission can be achieved from a carbon nanotube based molecular system through a forward biased p-n junction in which holes and electrons are injected across the space charge region. Recombination of excess electrons and holes in the space charge region can result in emission of photons, as in conventional direct bandgap semiconductor light emitting diodes. According to an embodiment of the present invention, however, the p and n regions are opposite ends of a single molecule, as contrasted to previous work involving polymeric or organic films and crystals.

Figure 2:
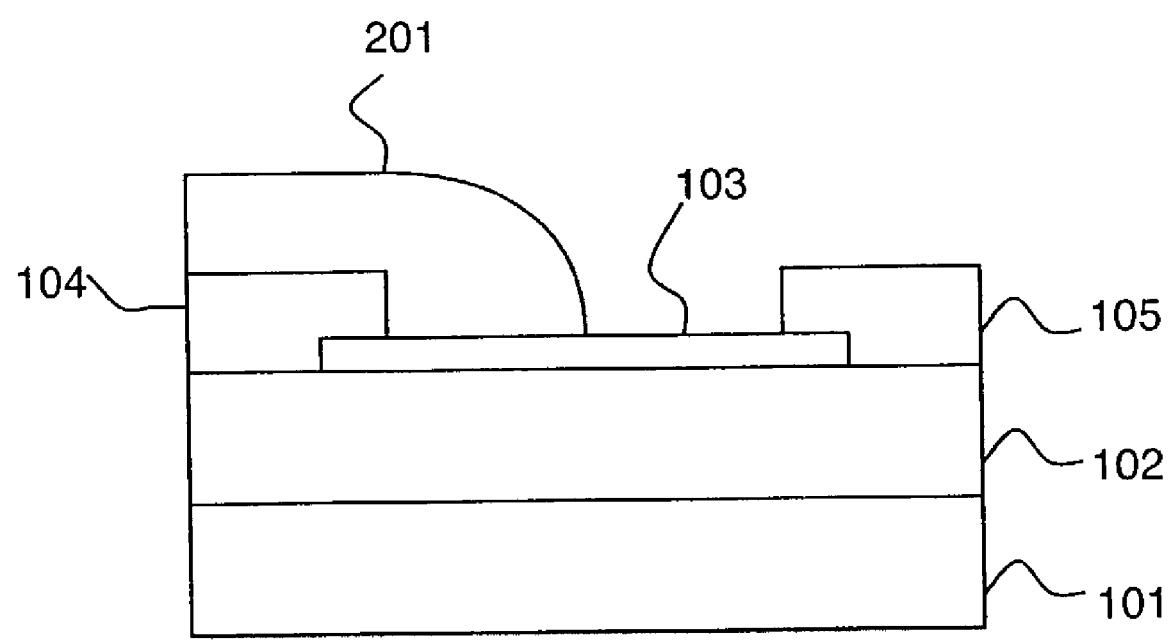
FIG. 2 is a diagram of a molecular optical emission device according to an embodiment of the present invention.

Referring to FIG. 2, p and n regions can be created in a single molecule by selecting doping. For example, an intrinsically p type carbon nanotube molecule 103 can be placed between source 104 and drain 105 electrodes. One end of the molecule is masked 201 using lithographic techniques, including for example, electron-beam lithography. The exposed end can then be doped. The exposed end of the intrinsically p-type molecule is doped to create an n-type region in the exposed area, e.g., by potassium doping. Thus, a p-n junction is created within the molecule that is then forward biased to create recombination radiation.

According to an embodiment of the present invention, a nanotube based light emitting device can be a two-terminal p-n device or a three-terminal device. Referring to FIG. 2, the two-terminal p-n device comprising a source 104 and a drain 105 can be formed, wherein the nanotube 103 is chemically doped. The two-terminal device does not comprise a gate, and thus, a chemically doped nanotube can be implemented to produce a p-n junction. To generate light, a bias voltage can be applied across the molecule 103, wherein a negative terminal is coupled to the n-type end of the molecule and a positive terminal is coupled to the p-type end of the molecule. The three-terminal device comprises a source 104, a drain 105 and a gate 101, and the nanotube 103 can be chemically undoped, or chemically doped to augment field doping.

Figure 3:
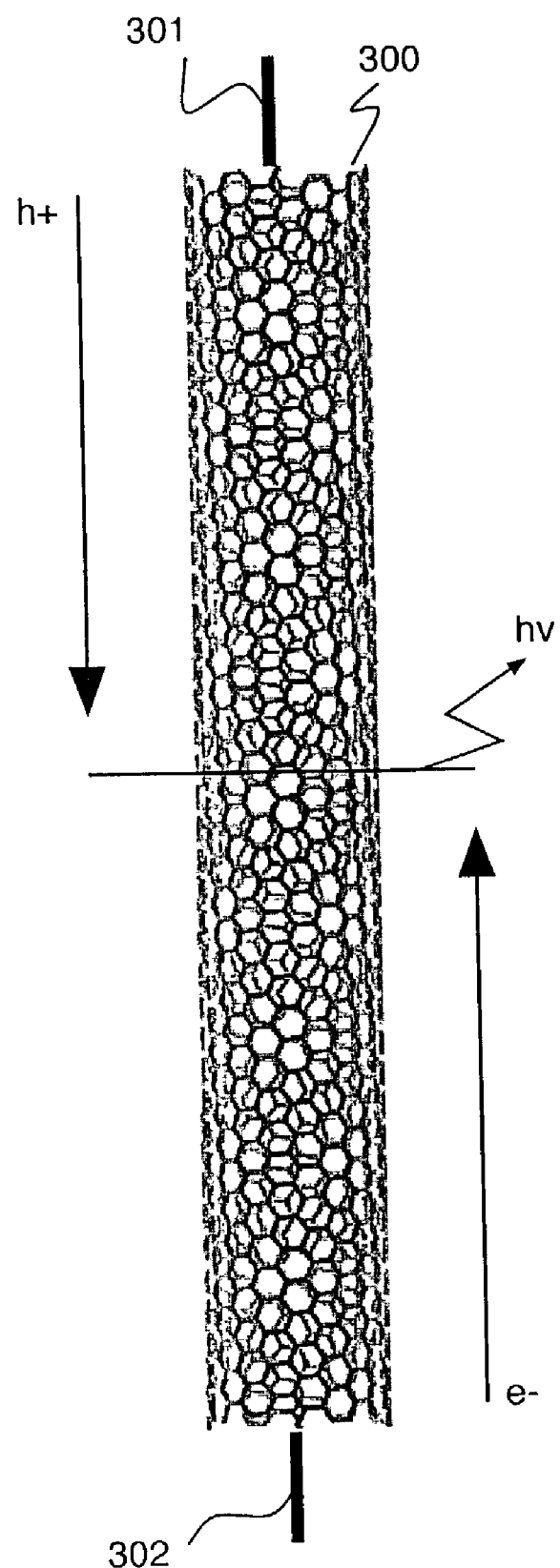
FIG. 3 is a diagram of a nanotube according to an embodiment of the present invention.

Referring to FIG. 3, a single molecule 300 demonstrating ambipolar behavior is placed between drain 301 and source 302 electrodes in a field effect structure. The structure is then biased with the value of the gate voltage between the drain 301 and source 302 voltages. The gate field allows hole injection at one end of the nanotube and thus behaves as p-doped, and alternatively allows electron injection at another end of the nanotube and thus behaves as n-doped. Because of the opposite sign of the gate field at ends of the molecule, one side of the molecule is p doped (h+) and the other side of the molecule is n doped (e−). Since the p doped region is on the side which has the higher voltage, the p-n junction created in the molecule is forward biased. In this manner, a forward biased p-n junction is created in a single molecule allowing for recombination radiation (hv) to be created by the current. The recombination radiation occurs along the nanotube body in the region of the p and n regions as shown in FIG. 3.

A prototype light emitting device has been constructed using a carbon nanotube. This example uses the first embodiment described above. The prototype device comprises a single carbon nanotube in a field effect structure. (See FIG. 1) This device demonstrated ambipolar electrical conductivity.

Figure 4:
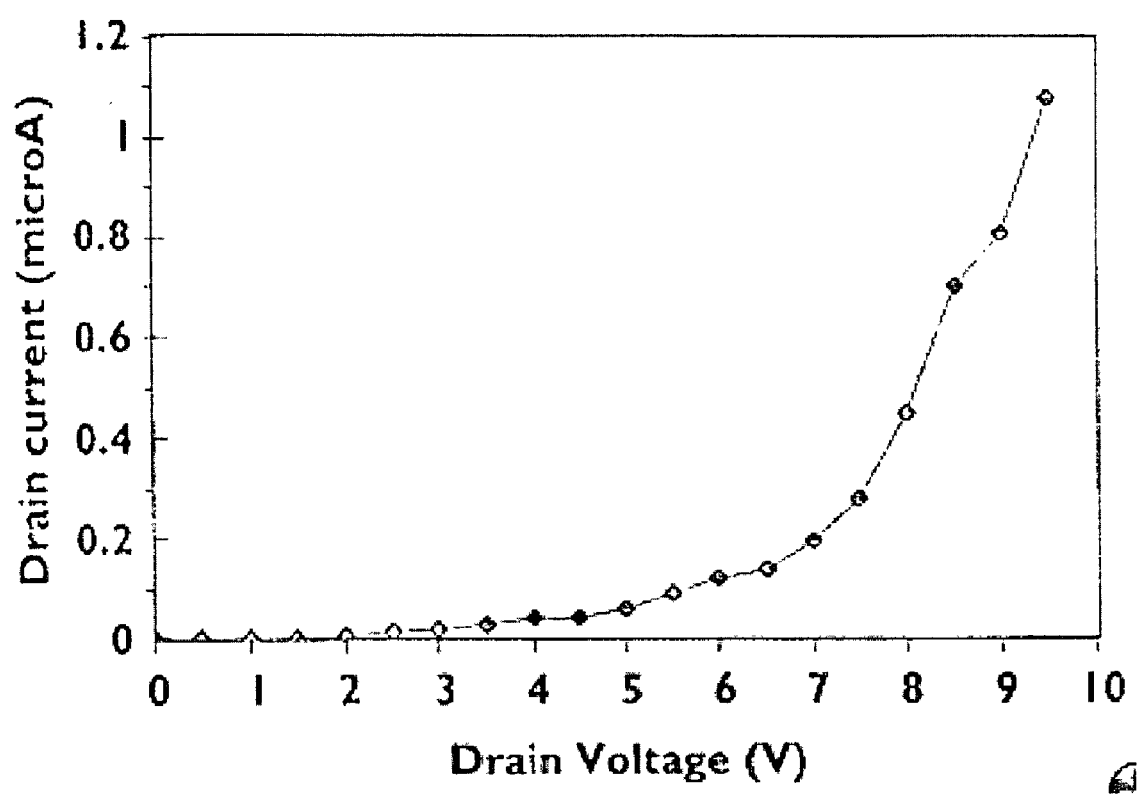
FIG. 4 is a graph of drain current versus drain voltage according to an embodiment of the present invention.

The voltages at the terminal of the device can be scaled with the thickness of the oxide. With a source voltage near 0 (for example, +/−½ volt), the drain voltage is two times the gate voltage. For example, optical emission has been observed from the device by grounding the source, fixing the gate at +5 volts, and placing a +10 volt bias on the drain for a gate thickness of 100 nm. A charge density can be between $10^8$ Amps/cm$^2$ and $10^9$ Amps/cm$^2$, however this can vary with device parameters and geometry. One of ordinary skill in the art would appreciate, in light of the present disclosure, that an operation voltage of the device can depend on device parameters and geometry. For example, a thinner gate oxide implies lower gate voltage operation. Near the source, the nanotube is n-doped because of the field effect doping. With the opposite field on the nanotube near the drain, the nanotube is p-doped in this region. In FIG. 4, the drain current is plotted as a function of drain voltage when sweeping from 0 to +10 volts with the gate voltage at +5 volts and the source grounded.

Optical emission is observed from the device when operated in the forward-biased junction mode. The emission is in the infrared, as expected from the small bandgap of the carbon nanotube. Since the bandgap of semiconductor nanotube scale as 1/d, where d is the diameter of the tube, the emission of the device can be adjusted within a range from the infrared to the visible light.

Figure 5:
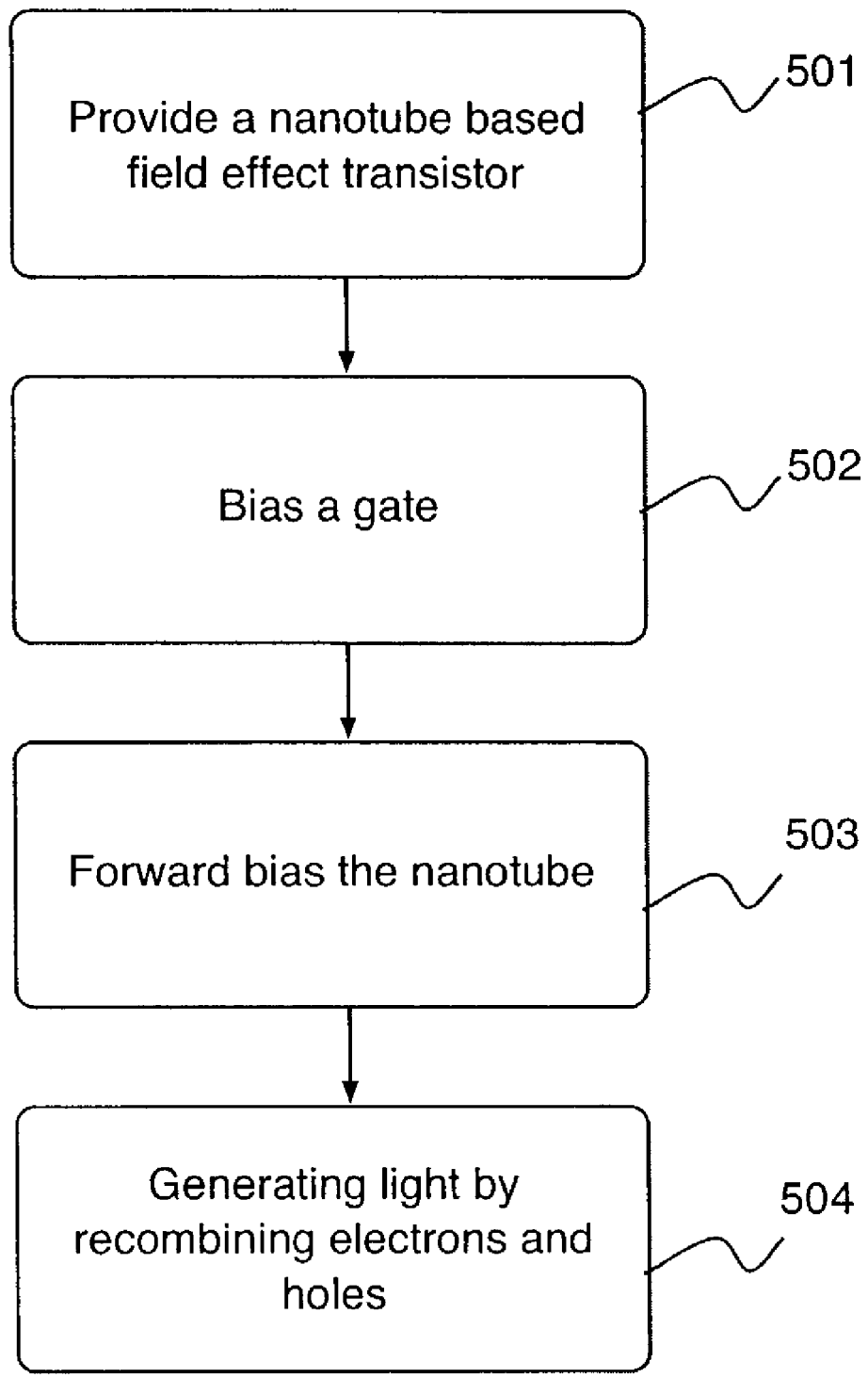
FIG. 5 is a flow chart of a method according to an embodiment of the present invention.

Referring to FIG. 5, a method for generating light comprises providing a field effect transistor comprising a source, a drain, a gate and a carbon nanotube channel having a diameter adapted to generate light of a desired wavelength 501. The gate can be biased with a voltage of about plus 5 volts 502, whereas the carbon nanotube channel can be forward-biased by applying a voltage of about plus 10 volts to the drain 503. The recombining of an electron and a hole generates light of the desired wavelength 504. Nanotubes can be used to generate light a portion of a spectrum including infrared and visible light according to the diameter of the nanotube.

An advantage of this device is to allow electrically induced optical emission to be observed from a single molecule. Moreover, the carrier injection into this molecular device is highly efficient because the Schottky barrier is thin due to the one-dimensional electrostatic effects in nanotubes, e.g., tunneling rates at the contacts is high even for contacts with Fermi-level placed at mid-gap. The properties of the nanotube Schottky barriers in this one-dimensional system does not limit much the current and high injection rate is obtained, which favors higher efficiency for the emission. Therefore, this contact scheme does not need a specially designed contact with asymmetrical injection as it is usually the case in photon sources.

Having described preferred embodiments of a molecular scale device capable of electrically induced optical emission, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A light emitting device comprising:
   a gate electrode;
   a channel comprising a plurality of ambipolar nanotubes for electrically stimulated optical emission, wherein the nanotubes are disposed within an effective range of the gate electrode;
   a first electrode coupled to a first end of the channel injecting electrons into the channel; and
   a second electrode coupled to a second end of the channel injecting holes into the channel,
   wherein the plurality of ambipolar nanotubes are disposed between the first electrode and the second electrode.

2. The light emitting device of claim 1, further comprising a cap formed over an entire length of the nanotubes exposed between the first electrode and the second electrode.

3. The light emitting device of claim 1, wherein the cap is a passivating layer.

4. The light emitting device of claim 1, further comprising a gate oxide disposed between the gate electrode and the nanotubes.

5. The light emitting device of claim 1, wherein the gate electrode is disposed within a substrate.

6. The light emitting device of claim 1, wherein the gate electrode is a substrate.

* * * * *